(12) United States Patent  
Sawada et al.

(10) Patent No.: US 8,097,958 B2  
(45) Date of Patent: Jan. 17, 2012

(54) FLIP CHIP CONNECTION STRUCTURE HAVING POWDER-LIKE CONDUCTIVE SUBSTANCE AND METHOD OF PRODUCING THE SAME

(75) Inventors: Susumu Sawada, Osaka (JP); Seiichi Nakatani, Osaka (JP); Seiji Karashima, Osaka (JP); Takashi Kitae, Osaka (JP)

(73) Assignee: Panasonic Corporation, Osaka (JP)

( * ) Notice: Subject to any disclaimer, the term of this patent is extended or adjusted under 35 U.S.C. 154(b) by 379 days.

(21) Appl. No.: 12/298,464

(22) PCT Filed: Apr. 18, 2007

(86) PCT No.: PCT/JP2007/058418  
§ 371 (c)(1),  
(2), (4) Date: Oct. 24, 2008

(87) PCT Pub. No.: WO2007/125789  
PCT Pub. Date: Nov. 8, 2007

(65) Prior Publication Data  
US 2009/0102064 A1 Apr. 23, 2009

(30) Foreign Application Priority Data  
Apr. 27, 2006 (JP) .................................. 2006-123846

(51) Int. Cl.  
*H01L 23/48* (2006.01)  
*H01L 23/52* (2006.01)  
*H01L 29/40* (2006.01)

(52) U.S. Cl. ........ 257/778; 257/737; 257/738; 257/777; 257/780; 257/E23.033; 257/E23.068; 257/E23.069; 257/E21.508

(58) Field of Classification Search .................. 257/737, 257/777, 778, 780, 738, E23.021, E23.033, 257/E23.068, E23.069, E21.508  
See application file for complete search history.

(56) References Cited

U.S. PATENT DOCUMENTS  
5,145,532 A 9/1992 Fukunaga et al.  
5,508,228 A * 4/1996 Nolan et al. .................. 438/614  
(Continued)

FOREIGN PATENT DOCUMENTS  
CN 1132931 10/1996  
(Continued)

*Primary Examiner* — Minh-Loan T Tran  
*Assistant Examiner* — Teresa M Arroyo  
(74) *Attorney, Agent, or Firm* — Hamre, Schumann, Mueller & Larson, P.C.

(57) ABSTRACT

A connection structure (package 10) has a first plate body 101 and a second plate body; in the first plate body 101, a wiring pattern having a plurality of connection terminals 102 is formed, and the second plate body has at least two connection terminals (electrode terminals 104) arranged facing the connection terminals of the first plate body 101. The connection terminals of the first and second plate bodies are connection terminals formed as projections on the surfaces of the first and second plate bodies. A conductive substance 108 is accumulated to cover at least a part of each side face of the connection terminals opposed to each other of the first and second plate bodies, and the connection terminals thus opposed are connected to each other via the conductive substance. The package thus formed is ready for a high-pin-count, narrow-pitch configuration of a next-generation semiconductor chip, and exhibits excellent productivity and reliability. The present invention is advantageous for such a package, for a connection structure applicable to the production of the package, and for a method of producing the connection structure.

33 Claims, 5 Drawing Sheets

U.S. PATENT DOCUMENTS

| | | | |
|---|---|---|---|
| 5,872,400 A * | 2/1999 | Chapman et al. | 257/738 |
| 5,903,056 A * | 5/1999 | Canning et al. | 257/773 |
| 6,184,577 B1 * | 2/2001 | Takemura et al. | 257/701 |
| 6,410,415 B1 * | 6/2002 | Estes et al. | 438/612 |
| 2002/0014703 A1 * | 2/2002 | Capote et al. | 257/778 |
| 2002/0027294 A1 * | 3/2002 | Neuhaus et al. | 257/778 |
| 2002/0175407 A1 * | 11/2002 | Morimoto et al. | 257/734 |
| 2003/0080437 A1 * | 5/2003 | Gonzalez et al. | 257/778 |
| 2004/0262035 A1 * | 12/2004 | Ko et al. | 174/260 |
| 2005/0282924 A1 * | 12/2005 | Katogi et al. | 522/170 |
| 2006/0025500 A1 * | 2/2006 | Rumer et al. | 523/200 |
| 2006/0065978 A1 * | 3/2006 | Nishiyama et al. | 257/737 |
| 2006/0071337 A1 * | 4/2006 | Shi et al. | 257/753 |
| 2007/0001313 A1 | 1/2007 | Fujimoto et al. | |
| 2007/0045869 A1 * | 3/2007 | Ho et al. | 257/780 |
| 2008/0142966 A1 * | 6/2008 | Hirano et al. | 257/737 |

FOREIGN PATENT DOCUMENTS

| | | |
|---|---|---|
| EP | 1 615 263 | 1/2006 |
| JP | 1-157796 | 6/1989 |
| JP | 8-186156 | 7/1996 |
| JP | 2000-94179 | 4/2000 |
| JP | 2000-332055 | 11/2000 |
| JP | 2003-347356 | 12/2003 |
| JP | 2004-260131 | 9/2004 |

* cited by examiner

FLIP CHIP CONNECTION STRUCTURE HAVING POWDER-LIKE CONDUCTIVE SUBSTANCE AND METHOD OF PRODUCING THE SAME

TECHNICAL FIELD

The present invention relates to a connection structure in which one plate body having a plurality of connection terminals and another plate body having a plurality of connection terminals (here, the term "connection terminal" also implies electrode terminals) are opposed to each other and the connection terminals of the opposed plate bodies are connected electrically, and also relates to a method of producing the connection structure. The present invention particularly relates to a high-productivity flip-chip package that is ready for a narrow-pitch semiconductor chip, to a connection structure applicable to a flip-chip mounting method, and to a method of producing the connection structure.

BACKGROUND ART

In recent years, with a trend toward a higher density and a higher degree of integration of semiconductor integrated circuits (LSI) used in electronic equipment, the number of pins of the electrode terminals of an LSI chip has been increased and the pitch thereof has decreased rapidly. For mounting LSI chips on wiring boards, flip chip mounting is used widely in order to decrease a wiring delay.

In the flip chip mounting, solder bumps generally are formed on electrode terminals of a LSI chip, which then are joined to electrodes formed on the wiring board at one time via the foregoing solder bumps.

However, in order to mount a next-generation LSI having over 5000 electrode terminals onto a wiring board, it is necessary that solder bumps corresponding to a narrow pitch of 100 µm or less should be formed on the wiring board, but it is difficult to adapt to it with a current technique for forming solder bumps.

Moreover, since it is necessary to form a large number of solder bumps that correspond to the number of the electrode terminals, the productivity has to be raised by shortening a mounting cycle (tact time) for each chip, along with the reduction in cost.

Conventionally, as a technique for forming solder bumps, plating, screen printing, and the like have been developed. The plating is suitable for a narrow pitch, but has a problem in productivity due to its complicated process. On the other hand, the screen printing has excellent productivity, but is not suitable for narrowing a pitch because of the use of a mask.

In the light of the problems described above, several techniques for forming solder bumps selectively on electrodes of a LSI chip or a wiring board have been developed recently. These techniques not only are suitable for forming fine bumps but also have excellent productivity because they can form the bumps all at one time, and attract attention as techniques that are adaptable to the mounting of the next-generation semiconductor chip on the wiring board.

As one of these techniques, there is the following technique: a solder paste, which is a mixture of solder powder and flux, is applied wholly onto a board whose surface is provided with electrodes, and the board is heated so as to melt the solder powder, whereby solder bumps are formed selectively on the electrodes that have high wettability, without short circuits occurring between adjacent electrodes (see Patent Document 1, for example).

There also is a technique called a super solder method. According to this technique, a paste-like composition (chemical reaction deposition-type solder) that contains an organic acid lead salt and metallic tin as main components is applied wholly onto a wiring board on which electrode terminals are formed, and the wiring board is heated so as to cause a substitution reaction between Pb and Sn, thereby depositing a Pb/Sn alloy selectively on the electrodes of the board (see Patent document 2, for example).

Conventional flip chip mounting further requires the step of injecting a resin called an underfill between the semiconductor chip and the wiring board in order to fix the semiconductor chip on the wiring board, after mounting the semiconductor chip on the wiring board on which solder bumps are formed. Because of this, there also have been problems of an increase in the number of steps and a decrease in a yield.

Then, as a method for establishing an electric connection between electrode terminals of the semiconductor chip and connection terminals of the wiring board, which are opposed to each other, and fixing the semiconductor chip onto the wiring board both at the same time, a flip chip mounting technique using an anisotropic electrically conductive material has been developed. In this technique, by supplying a thermosetting resin containing electrically conductive particles between the wiring board and the semiconductor chip, and then heating and setting the thermosetting resin while applying a pressure to the semiconductor chip at the same time, it is possible to establish the electric connection between the semiconductor chip and the wiring board and fix the semiconductor chip to the wiring board at the same time (for example, see Patent Document 3).

Patent Document 1: JP 2000-94179 A
Patent Document 2: JP 1(1989)-157796 A
Patent Document 3: JP 2000-332055 A

DISCLOSURE OF INVENTION

Problem to be Solved by the Invention

However, in both of the method for forming solder bumps described in Patent Document 1 and the super solder method described in Patent Document 2, since the paste-like composition simply is supplied onto the wiring board by application, local variations in thickness and concentration occur, resulting in variations in the solder deposition amount for individual electrode terminals and connection terminals. Consequently, it is not possible to achieve solder bumps with uniform heights. Also, in these methods, since the paste-like composition is supplied by application onto the wiring board whose surface is provided with the connection terminals, namely, with projections or depressions, a sufficient amount of solder cannot be supplied onto the connection terminals serving as the projections, making it difficult to achieve a desired solder bump height necessary for the flip chip mounting.

Moreover, in the flip chip mounting method described in Patent Document 3, there are many problems in productivity and reliability that are to be solved as described below.

Since the electrical conduction is achieved between opposed terminals only by mechanical contact via conductive particles uniformly dispersed in a resin, the conductive particles contributing to the conduction between the opposed terminals are limited to only a part of conductive particles contained in the resin. Particularly in the field of the packaging of a next-generation LSI chip that is required to have a higher connection density, a reduced size, a reduced thickness, the electrode size and the pattern dimensions have been decreased extremely owing to the increased number of pins of connection terminals and the decreased pitch thereof. As a result, the number of conductive particles captured between opposed connection terminals decreases, and hence, it is difficult to achieve a stable conduction state.

Further, in the method of electrical connection via an anisotropic electrically conductive adhesive material or an anisotropic electrically conductive film, conductive particles uniformly dispersed in a resin come to have a function of electrically connecting opposed terminals when being sandwiched between the opposed terminal top faces, whereas they also can cause short circuits between adjacent terminals when remaining between the adjacent terminals. Therefore, a difficulty lies in adopting a narrow-pitch configuration. In other words, there is a problem that conductive particles that are not involved in the conduction between opposed terminals become a factor inhibiting the insulation between adjacent terminals, thereby decreasing the yield.

Still further, there remains a challenge of more uniformly dispersing smaller-size conductive particles, so as to be suitable for a decreased pitch.

It should be noted that "adjacent terminals" refer to connection terminals that exist adjacent in a horizontal direction with respect to an opposition direction in which opposed terminals are opposed to each other; if the opposition direction in which opposed terminals are opposed to each other is a vertical direction, "adjacent terminals" refer to connection terminals that exist adjacent in a direction perpendicular to the opposition direction, that is, in a horizontal direction.

The connection structure of the present invention applicable to a package has been made to solve the above-described problems, and an object of the present invention is to provide a package with high productivity and reliability obtained by packaging, on a wiring board, a next-generation semiconductor chip that is required to have a higher-pin-count and narrower-pitch configuration; a connection structure applicable for a packaging method for the foregoing package; and a method for producing the connection structure.

Means for Solving Problem

To solve the above-described conventional problems, the connection structure of the present invention is:

(1) A connection structure comprising:
a first plate body on which a wiring pattern having a plurality of connection terminals is formed; and
a second plate body having at least two connection terminals arranged so as to be opposed to the connection terminals of the first plate body,
wherein
the connection terminals of the first plate body and the connection terminals of the second plate body each are formed in a projection form, on a surface of the first plate body and a surface of the second plate body, respectively;
a conductive substance is accumulated so as to cover at least a part of each side face of the opposed connection terminals of the first and second plate bodies, whereby the opposed connection terminals are connected electrically with each other via the conductive substance, and
the opposed connection terminals of the first and second plate bodies are in either a state (a) such that top faces of the connection terminals of the first and second plate bodies at least partially are in direct contact with each other, or a state (b) such that the conductive substance further is interposed at least partially between opposed top faces of the connection terminals of the first and second plate bodies.

(2) In the connection structure described in the above item (1), preferably, the conductive substance accumulated so as to cover at least a part of each side face of the opposed connection terminals of the first and second plate bodies is made of a powder-like conductive substance, so that the opposed connection terminals are connected electrically by contact of particles of the powder-like conductive substance.

(3) Further, in the connection structure described in the above item (1), preferably, the conductive substance accumulated so as to cover at least a part of each side face of the opposed connection terminals of the first and second plate bodies is molten and solidified thereby forming connection bodies, so that the opposed connection terminals are connected electrically by the connection bodies.

(4) Further, in the connection structure described in the above item (1), preferably, the conductive substance interposed between the opposed top faces of the connection terminals of the first and second plate bodies is embedded in parts of the top faces of the connection terminals of the first and second plate bodies.

(5) Further, in the connection structure described in the above item (1), preferably, the conductive substance interposed between the opposed top faces of the connection terminals of the first and second plate bodies is sandwiched in parts of gaps between the top faces of the connection terminals of the first and second plate bodies.

(6) Further, in the connection structure described in the above item (4) or (5), preferably, at least a part of the conductive substance interposed between the opposed top faces of the connection terminals of the first and second plate bodies is molten and solidified, thereby wetting at least parts of the top faces of the connection terminals of the first and second plate bodies.

(7) Further, in the connection structure described in any one of the above items (1) to (6), preferably, entire side faces of the opposed connection terminals of the first and second plate bodies are covered with the conductive substance.

(8) Further, in the connection structure described in any one of the above items (1) and (3) to (6), preferably, entire side faces of the opposed connection terminals of the first and second plate bodies are covered with connection bodies formed with the molten and solidified conductive substance.

(9) Further, in the connection structure described in any one of the above items (1) to (8), preferably, the first plate body is a plate body containing an inorganic filler and a thermosetting resin.

(10) Further, in the connection structure described in any one of the above items (1) to (8), preferably, the first plate body is a plate body containing
at least one reinforcing material selected from a woven fabric of a glass fiber, a nonwoven fabric of a glass fiber, a woven fabric of a heat-resistant organic fiber, and a nonwoven fabric of a heat-resistant organic fiber, and
a thermosetting resin composition impregnated in the reinforcing material.

(11) Further, in the connection structure described in any one of the above items (1) to (8), preferably, the first plate body is a plate body including a flexible board comprising a film and a wiring pattern.

(12) Further, in the connection structure described in any one of the above items (1) to (11), preferably, the second plate body is an active element.

(13) Further, in the connection structure described in any one of the above items (1) to (11), preferably, the second plate body is a semiconductor chip.

(14) Further, in the connection structure described in any one of the above items (1) to (11), preferably, the second plate body is either a plate body containing at least one reinforcing material selected from a woven fabric of a glass fiber, a nonwoven fabric of a glass fiber, a woven fabric of a heat-resistant organic fiber, and a nonwoven fabric of a heat-resistant organic fiber; and a thermosetting resin composition impregnated in the reinforcing material, or a plate body containing an inorganic filler and a thermosetting resin.

(15) Further, in the connection structure described in any one of the above items (1) to (11), preferably, the second plate body is a plate body including a flexible board comprising a film and a wiring pattern.

(16) Further, in the connection structure described in any one of the above items (1) to (2) and (4) to (5), preferably, the conductive substance contains at least any of metal particles made of a single metal composition, solder particles, metal particles plated with solder or metal, and resin particles plated with solder or metal.

(17) Further, in the connection structure described in any one of the above items (1) to (16), preferably, the conductive substance comprises two types of conductive substances.

(18) Further, in the connection structure described in any one of the above items (1) to (17), preferably, a resin or a resin composition is filled between the first plate body and the second plate body.

(19) Further, in the connection structure described in the above item (18), preferably, the resin or the resin composition is made of a resin or a resin composition in a sheet form or a paste form.

(20) Next, a method of the present invention for producing a connection structure is a method of producing a connection structure in which a second plate body having, on its surface, at least two connection terminals each formed in a projection form is arranged so as to be opposed to a first plate body having, on its surface, a wiring pattern having a plurality of connection terminals each in a projection form, and the connection terminals of the first plate body and the connection terminals of the second plate body are connected electrically, the method comprising:

the first step of aligning the connection terminals of the first plate body and the connection terminals of the second plate body so that they are opposed to each other, so that opposed top faces of the connection terminals of the first plate body and the connection terminals of the second plate body are brought into contact with each other at least partially;

the second step of supplying a resin composition containing the conductive substance and the convective additive into a gap between the first plate body and the second plate body; and the third step of heating the resin composition, wherein in the heating step (iii), convection occurs in the resin composition owing to bubbles generated mainly from the convective additive, thereby causing at least a part of the conductive substance in the resin composition interposed between the adjacent connection terminals to accumulate in a self-assembly manner so as to cover at least a part of each side face of the opposed connection terminals, whereby the opposed connection terminals of the first and second plate bodies are connected electrically.

(21) Further, in the method of producing a connection structure described in the above item (20), preferably, in the third step, the conductive substance accumulated so as to cover at least a part of each side face of the opposed connection terminals of the first and second plate bodies is further molten and solidified so as to form connection bodies, whereby the connection bodies electrically connect the connection terminals of the first plate body and the connection terminals of the second plate body with each other.

(22) Further, in the method of producing the connection structure described in the above item (20), preferably in the third step, the conductive substance accumulated so as to cover at least a part of each side face of the opposed connection terminals of the first and second plate bodies is a powder-like conductive substance, so that contact of particles of the powder-like conductive substance electrically connects the connection terminals of the first plate body and the connection terminals of the second plate body with each other.

(23) Further, another method of the present invention for producing a connection structure is a method of producing a connection structure in which a second plate body having, on its surface, at least two connection terminals each formed in a projection form is arranged so as to be opposed to a first plate body having, on its surface, a wiring pattern having a plurality of connection terminals each in a projection form, and the connection terminals of the first plate body and the connection terminals of the second plate body are connected electrically, the method comprising:

(iv) supplying a resin composition containing the conductive substance and the convective additive over the first plate body;

(v) aligning the connection terminals of the first plate body and the connection terminals of the second plate body so as to sandwich the resin composition between the connection terminals of the first plate body and the connection terminals of the second plate body, and pressing the same so as to provide electric connection; and (vi) heating the resin composition, wherein in the heating step (vi), convection occurs in the resin composition owing to bubbles generated mainly from the convective additive, thereby causing at least a part of the conductive substance in the resin composition interposed between the adjacent connection terminals to accumulate in a self-assembly manner so as to cover at least a part of each side face of the opposed connection terminals, whereby the opposed connection terminals of the first and second plate bodies are connected electrically.

(24) Further, in the method of producing a connection structure described in the above item (23), preferably, in the step (v), the conductive substance sandwiched between the opposed connection terminals of the first and second plate bodies is caused to be embedded in parts of the connection terminals of the first and second plate bodies.

(25) Further, in the method of producing a connection structure described in the above item (23) or (24), preferably, in the step (vi), the conductive substance sandwiched between the opposed connection terminals of the first and second plate bodies is molten and solidified, thereby wetting at least parts of the top faces of the connection terminals of the first and second plate bodies.

(26) Further, in the method of producing a connection structure described in the above item (23) or (24), preferably, in the step (vi), the conductive substance sandwiched between the opposed top faces of the connection terminals of the first and second plate bodies is molten and solidified, thereby wetting at least parts of the top faces of the connection terminals of the first and second plate bodies, and the conductive substance accumulated so as to cover at least a part of each side face of the connection terminals of the first and second plate bodies is molten and solidified thereby forming connection bodies, so that the connection terminals of the first plate body and the connection terminals of the second plate body are connected electrically with each other by the connection bodies.

(27) Further, in the method of producing a connection structure described in any one of the above items (20) to (26), preferably, the first plate body is either a plate body containing at least one reinforcing material selected from a woven fabric of a glass fiber, a nonwoven fabric of a glass fiber, a woven fabric of a heat-resistant organic fiber, and a nonwoven fabric of a heat-resistant organic fiber, and a thermosetting resin composition impregnated in the reinforcing material, or a plate body containing an inorganic filler and a thermosetting resin.

(28) Further, in the method of producing a connection structure described in any one of the above items (20) to (26), preferably, the first plate body is a plate body including a flexible board comprising a film and a wiring pattern.

(29) Further, in the method of producing a connection structure described in any one of the above items (20) to (28), preferably, the second plate body is an active element.

(30) Further, in the method of producing a connection structure described in any one of the above items (20) to (28), preferably, the second plate body is a semiconductor chip.

(31) Further, in the method of producing a connection structure described in any one of the above items (20) to (28), preferably, the second plate body is either a plate body containing at least one reinforcing material selected from a woven fabric of a glass fiber, a nonwoven fabric of a glass fiber, a woven fabric of a heat-resistant organic fiber, and a nonwoven fabric of a heat-resistant organic fiber, and a thermosetting resin composition impregnated in the reinforcing material, or a plate body containing an inorganic filler and a thermosetting resin.

(32) Further, in the method of producing a connection structure described in any one of the above items (20) to (28), preferably, the second plate body is a plate body including a flexible board comprising a film and a wiring pattern.

(33) Further, in the method of producing a connection structure described in any one of the above items (20) to (32), preferably, the convective additive is an additive that generates bubbles so as to cause convection in the resin composition when the resin composition is heated in the third step or the step (vi).

(34) Further, in the method of producing a connection structure described in any one of the above items (20) to (33), preferably, the conductive substance contains at least any of metal particles made of a single metal composition, solder particles, metal particles plated with solder or metal, and resin particles plated with solder or metal.

(35) Further, in the method of producing a connection structure described in any one of the above items (20) to (22), preferably, further includes, prior to the step (i), the step of supplying a second conductive substance to the opposed top faces of either the connection terminals of the first plate body or the connection terminals of the second plate body preliminarily.

(36) Further, in the method of producing a connection structure described in any one of the above item (35), preferably, the second conductive substance is a conductive substance having a melting point different from that of the conductive substance used in the step (ii).

Effects of the Invention

As described above, with the connection structure and the method of producing the same of the present invention, a connection structure with excellent reliability such as a package can be realized that ensures sure connection between the second plate body (a semiconductor chip, for example) and the first plate body (a wiring board, for example) and the insulation between adjacent terminals that is ready for a narrow-pitch configuration. Since the state of connection between the opposed connection terminals ("connection terminals" implies electrode terminals) of the first and second plate bodies can be made uniform, the effects of increasing the yield and enhancing the production efficiency are generated, too.

In the connection structure and the method of producing the same according to the present invention, a resin composition containing a conductive substance is supplied to a gap between the first and second plate bodies, and particles of the conductive substance are accumulated so as to cover each side face of the terminals, thereby being brought into contact with one another, whereby the opposed connection terminals of the first and second plate bodies are connected electrically. Thus, by accumulating, on each terminal side face, the conductive substance in the resin composition interposed between the adjacent terminals, the proportion of the conductive substance in the resin composition in an area other than the areas on the terminal side faces can be decreased. Particularly, by setting the proportion of the conductive substance accumulated on the terminal side faces in the resin composition to an optimal amount for electric connection preliminarily, an amount of the conductive substance remaining between the adjacent terminals substantially can be decreased to null, whereby the insulation between the adjacent terminals is improved.

In other words, by accumulating the conductive substance interposed between the adjacent terminals on each terminal side face, the electric connection between the opposed terminals can be achieved and the insulation between the adjacent terminals can be improved at the same time, whereby a connection structure such as a package which achieves both of the electric connection and the insulation, and hence, achieves high reliability, can be realized.

Further, by causing the conductive substance not to remain between the adjacent terminals, the conductive substance contained in the resin composition can be used effectively, and smaller amounts of the materials for the conductive substance are needed, whereby an economical effect can be generated, too.

Further, by melting and subsequently solidifying the conductive substance accumulated on each terminal side face, if particles of the conductive substance are out of contact with one another once, they can be caused to adhere to one another again; and a self-alignment effect can be achieved in which if the connection terminals of the first plate body and the terminals of the second plate body opposed to each other are displaced from each other regarding their positions, the displacement can be corrected by surface tension of the conductive substance. By accumulating the conductive substance on each terminal side face, stress can be relaxed by utilizing the flexibility of the conductive substance layer thus formed on the side face, whereby the reliability of the connection structure such as the package with respect to the stress can be enhanced.

Further, in the connection structure and the method of producing the same according to the present invention, the conductive substance in the resin composition supplied to a gap between the first and second plate bodies is sandwiched between the opposed top faces of the connection terminals of the first and second plate bodies, whereby electric conduction between the opposed terminals can be obtained. The conductive substance not involved in the conduction remains in the resin composition between the adjacent terminals, but by thereafter accumulating the remaining conductive substance in the resin composition so as to cover each terminal side face so as to utilize the conductive substance effectively, the electric connection between the opposed terminals can be obtained further.

In other words, the first and second plate bodies are connected electrically via the conductive substance sandwiched between the opposed terminal top faces, and at the same time, they are connected electrically via the conductive substance accumulated on each terminal side face. Therefore, stable electric connection with further lower resistance between the opposed terminals can be realized.

Further, by accumulating, on each terminal side face, the conductive substance that is not involved in the conduction and remains between the adjacent terminals so as to utilize the same effectively, the problem that the remaining conductive substance causes short circuits between the adjacent terminals can be solved at the same time. Since the remaining conductive substance that causes short circuits is accumulated on each terminal side face forcibly, the insulation between the adjacent terminals can be enhanced, whereby a connection structure such as a package with excellent reliability can be realized.

In other words, with the present invention, the stable electric connection between the opposed terminals and the ensured insulation between the adjacent terminals can be realized at the same time.

As the size of the connection terminal is minimized by increasing the number of pins of connection terminals and decreasing the pitch thereof, the number of the captured particles of the conductive substance sandwiched between the opposed connection terminals decreases. This makes it difficult to provide stable electric connection only with electric connection between the opposed top faces of the opposed connection terminals. At the same time, as the pitch of the adjacent terminals is decreased, the problem of short circuits between the adjacent terminals owing to the remaining conductive substance becomes more serious. The connection structure and the method of producing the same according to the present invention are suitable for a package of a semiconductor chip of a narrow-pitch configuration, and a packaging method for the same, for example.

In addition, it is possible to use the resin composition remaining between the adjacent terminals as an underfill material by hardening the same. This causes the first and second plate bodies to be fixed in a state in which accumulations of the conductive substance on each terminal side face are connected electrically with one another, or alternatively, in the case of the embodiment in which the conductive substance is sandwiched between the top faces of the terminals, in a state in which the conductive substance sandwiched between the terminal top faces and the conductive substance accumulated on each terminal side face are connected electrically. As a result, the assured mechanical support of the first and second plate bodies and the reliable insulation between adjacent terminals are maintained.

With this method of producing a connection structure, since the electric connection between the opposed terminals of the first and second plate bodies and the fixing of the second plate body to the first plate body can be carried out at one time, a connection structure typified by a package with high productivity can be realized. The conventional flip-chip mounting requires a step of injecting an underfill between a semiconductor chip and a wiring board after the semiconductor ship is mounted on the wiring board, so as to fix the semiconductor ship to the wiring board. In contrast, the method of producing a connection structure according to the present invention does not require such a step of injecting an underfill material, and hence, an effect of decreasing the number of steps in the producing process and increasing a yield can be generated.

Still further, in the step of sandwiching the conductive substance between the opposed terminals, the distance between the opposed terminals may be controlled, but in the step of sandwiching or embedding the conductive substance between the opposed terminals by pressing the plate bodies, the control of the distance between the opposed terminals is unnecessary, and therefore, the simplification of the process and the device configuration can be achieved.

Figure 1A:
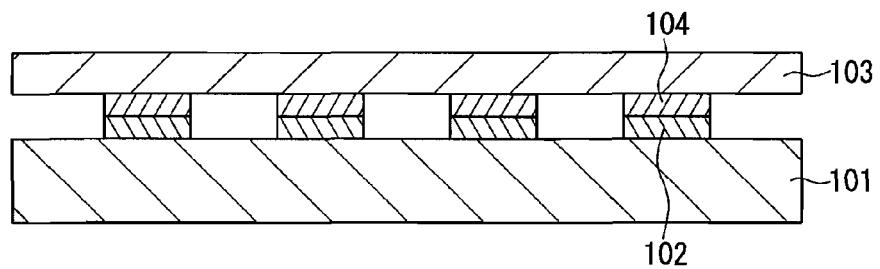
FIGS. 1A to 1D are schematic cross-sectional views showing a process, for explaining a package and a packaging method according to Embodiment 1 of the present invention.

DESCRIPTION OF REFERENCE NUMERALS 10 package
11 package
12 package
13 package
14 package
15 package
16 package
17 package
101 first plate body
102 connection terminal
103 second plate body
104 electrode terminal
105 conductive substance
106 resin composition
107 bubble
108 accumulated conductive substance on side faces of connection terminals and electrode terminals
109 hardened resin composition
110 molten-solidified conductive substance
111 conductive substance sandwiched between top faces of connection terminals and electrode terminals
112 convective additive

DESCRIPTION OF THE INVENTION

The following describes embodiments of a package and a packaging method of the present invention, as embodiments of a connection structure and a method of producing the same of the present invention, while referring to the drawings. In the drawings, for simplifying the descriptions, constituent elements having substantially the same functions are designated with the same reference numerals. It should be noted that the present invention is not limited to embodiments shown below.

Embodiment 1

Figure 1B:
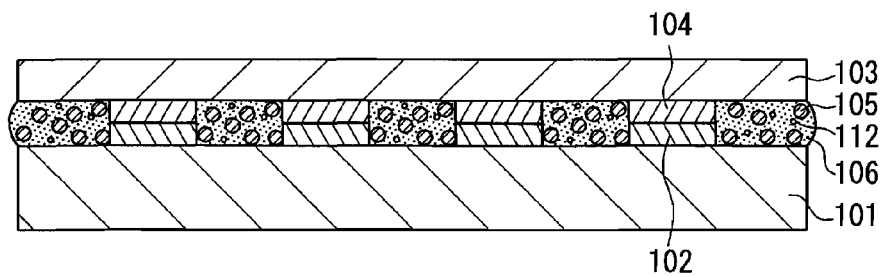
Figure 1C:
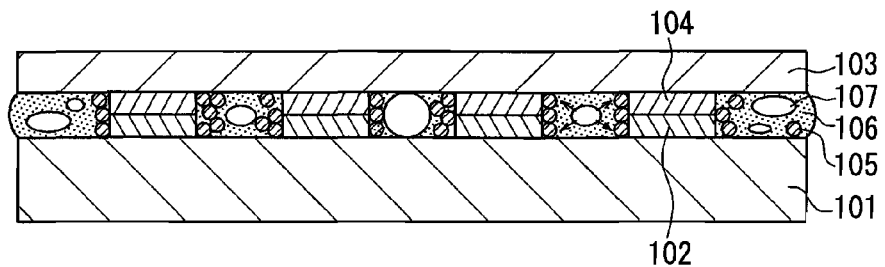
Figure 1D:
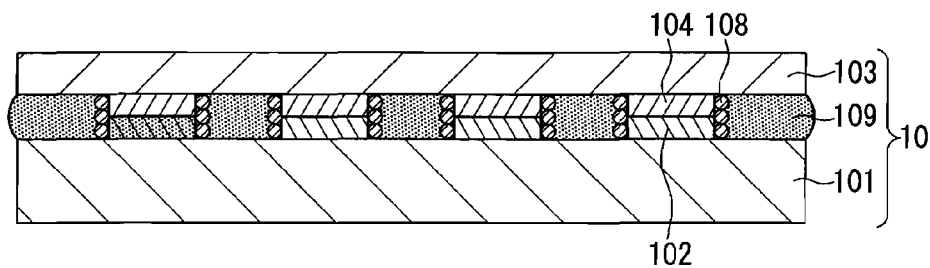
Figure 2:
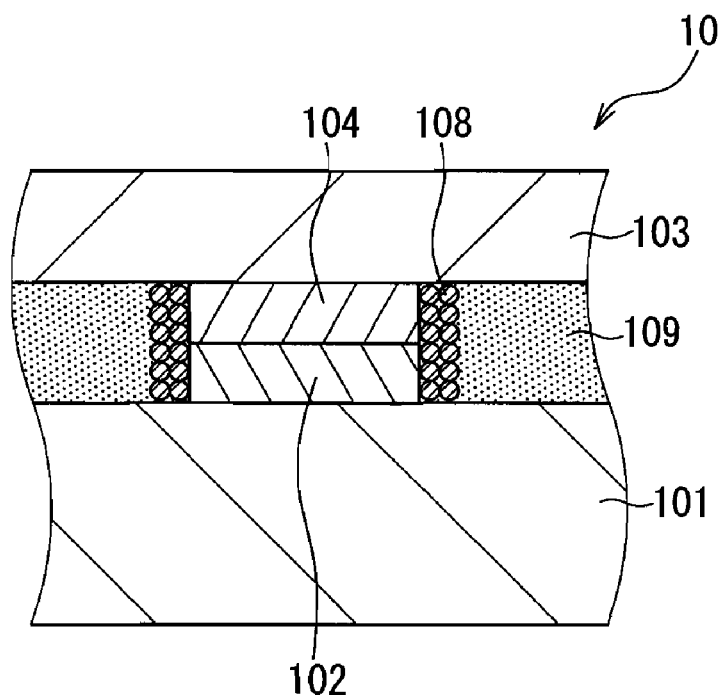
FIG. 2 is an enlarged cross-sectional view of a part of a package according to Embodiment 1 of the present invention.

The following describes a package 10 and a packaging method thereof according to Embodiment 1, while referring to FIGS. 1 and 2.

In FIGS. 1 and 2, "10" denotes a package according to Embodiment 1. "101" denotes a first plate body. "102" denotes a connection terminal formed in a form of a projection on the first plate body. "103" denotes a second plate body. "104" denotes an electrode terminal as one type of the connection terminal in a form of a projection formed on the second plate body. "105" denotes a conductive substance. "106" denotes a resin composition. "107" denotes a bubble. "108" denotes an accumulation of the conductive substance 105 on side faces of the terminals 102 and 104 opposed to each other. "109" denotes a hardened resin composition 106. "112" denotes a convective additive. The package 10 according to Embodiment 1 has a configuration as follows: a plurality of connection terminals 102 formed on the first plate body 101, and a plurality of electrode terminals 104 formed on the second plate body 103 arranged facing the first plate body 102, are connected electrically via the conductive material 105 (108).

FIGS. 1A to 1D are schematic cross-sectional views showing principal steps for producing the package 10 according to Embodiment 1 and a state of the same upon completion.

First of all, as shown in FIG. 1A, the first plate body 101 (for example, a circuit board such as a glass epoxy substrate) having a desired wiring pattern (not shown) with a plurality of the connection terminals 102 formed thereon, and the second plate board 103 (for example, a semiconductor chip) having a plurality of the electrode terminals 104 are arranged so as to face each other in a manner such that the connection terminals 102 of the first plate body 101 and the electrode terminals 104 of the second plate body 103 are in contact with each other. The first plate body 101 may be a substrate that contains an inorganic filler (for example, aluminum nitride, silica, or aluminum hydroxide) and a thermosetting resin (for example, an epoxy resin); alternatively, it may be a substrate that contains at least a reinforcing material impregnated with a thermosetting resin composition, the reinforcing material being selected from a woven fabric of a glass fiber, a nonwoven fabric of a glass fiber, a woven fabric of a heat-resistant organic fiber, and a nonwoven fabric of a heat-resistant organic fiber. In the present embodiment, an "ALIVH" substrate (produced by Panasonic Electronic Devices Co., Ltd.; a substrate made of a woven fabric of a glass fiber impregnated with an epoxy resin) is used. The second plate body 103 may be an active element or a semiconductor chip (for example, a bare chip), or alternatively it may be a substrate formed with a thermosetting resin (for example, epoxy resin, phenol resin, unsaturated polyester resin) and a reinforcing material. Further alternatively, it may be an electronic component (for example, a chip component). The first plate body 101 and the second plate body 103 may be rigid printed boards or flexible printed boards. It should be noted that the electrode terminals 104 may be provided with bumps on electrode pads preliminarily. The connection structure and the method of producing the same according to the present invention can be applied also to the case where both of the first and second plate bodies are rigid printed boards or the case where both are flexible printed boards.

There is no need for an operation of pressing the second plate body 103 for bringing the connection terminals 102 of the first plate body 101 and the electrode terminals 104 of the second plate body 103 into complete contact with each other, but what is needed is only to arrange the connection terminals 102 and the electrode terminals 104 so that they are opposed to each other and to maintain them in the opposed state. As clear from FIGS. 1 and 2, the connection terminal 102 is formed in the form of a projection on the surface of the first plate body, and likewise, the electrode terminal 104 is formed in the form of a projection on a surface of the second plate body. Preferably, each projection has a rectangular, square, trapezoidal, parallelogrammatic, or another-shape cross section that is taken in the thickness direction as shown in the drawings, and a top face thereof opposed to another projection is relatively flat ("relatively flat" means that preferably there is no projection or recess providing a large level difference exceeding ⅔ the thickness, whereas the top face preferably is roughened relatively finely). Besides, preferably, the top faces of the plurality of connection terminals 102 opposed to the electrode terminals 104 are at substantially the same levels of height, and are substantially parallel with a surface of the first plate body. Likewise, regarding the electrode terminals also, preferably, each projection has a rectangular, square, trapezoidal, parallelogrammatic, or another-shape cross section that is taken in the thickness direction as shown in the drawings, a top face thereof opposed to another projection is relatively flat ("relatively flat" means that preferably there is no projection or recess providing a large level difference exceeding ⅔ the thickness, whereas the top face preferably is roughened relatively finely). Besides, preferably, the top faces of the plurality of electrode terminals 104 opposed to the connection terminals 102 are at substantially the same levels of height, and are substantially parallel with a surface of the second plate body. It should be noted that regarding both of the terminals, terminal top faces on the sides opposed to each other may be curved to an extent such that the object of the present invention can be achieved.

Next, as shown in FIG. 1B, the resin composition 106 containing the conductive substance 105 and the convective additive 112 is supplied to the gap between the first and second plate bodies 101 and 103.

Here, the conductive substance 105, the convective additive 112, and the resin in the resin composition 106 used in the package or the packaging method of the present invention are not limited particularly, but the following materials may be used, respectively.

The conductive substance 105 is a substance containing at least any of metal particles, solder particles, metal particles plated with solder or metal, and resin particles plated with solder or metal. The solder component and the metal component of the foregoing particles and plating may be, for example, a Sn—Bi or Sn—Ag solder alloy, or a metal such as Cu, Ag, AgCu, or the like. In Embodiment 1, considering that electrical connection between the opposed terminals is provided by contact between particles of the conductive substance 108 accumulated in subsequent steps, it is preferable that the conductive substance 105 is uniformly dispersed in the resin composition 106 in a state in which each particle of the conductive substance 105 has a smallest possible oxide film grown on its surface.

The convective additive 112 is an additive that is expected to come to a boil or to be decomposed when the resin composition 106 is heated, thereby generating bubbles, and causing convection in the resin composition 106. Examples of the convective additive 112 of a boiling/vaporizing type include glycerol, wax, isopropyl alcohol, butyl acetate, butyl carbitol, and ethylene glycol, while examples of the convective additive 112 of a decomposing type include sodium hydrogencarbonate, ammonium metaborate, aluminum hydroxide, dawsonite, and barium metaborate. Bubbles and convection generated in the resin composition naturally occur in resin composition when the resin composition supplied to the gap between the first and second plate bodies 101 and 103 is heated, and the addition of the convective additive 112 to the resin composition 106 is intended to accelerate the foregoing behavior, thereby achieving the object of the present invention. In other words, the following effect is achieved: the bubbles 107 generated from the convective additive 112 cause convection in the resin composition 106, which disperses the conductive substance 105 in the resin composition 106, while squeezing the resin composition 106 out to each terminal side face owing to the pressure of the bubbles, whereby the resin composition 106 accumulates to cover at least a part of side faces of the connection terminals and the electrode terminals opposed to each other. The convective additive 112 preferably is a substance that boils or vaporizes when heated, and there is substantially no convective additive left in the resin composition 106 when the process is completed.

Here, the "convection" of the convective additive means a convection as a kinetic form, and it may be in any form as long as by the boiling convective additive moving in the resin composition 106 or by bubbles generated therein, kinetic energy is given to the conductive substance dispersed in the resin composition 106, whereby the movement of the conductive substance is accelerated.

The resin in the resin composition 106 preferably is, for example, a thermosetting resin such as an epoxy resin, a phenol resin, or a silicone resin; a heat resistant resin such as a fluorine resin, a polyimide resin, a polyamide-imide resin, or an aromatic polyamide resin; or a photo (UV) curing resin. Alternatively, a thermoplastic resin may be used, such as polyethylene, polypropylene, polystyrene, acrylonitrile/methacryl resin, or a vinyl chloride. A material of a combination of these also may be used.

The resin composition 106 is heated in this state. It should be noted that the heating of the resin composition 106 is carried out at a heating temperature higher than a boiling point or a decomposition point of the convective additive 112. In other words, in the case where the convective additive is of a type that generates bubbles when boiling or vaporizing, the heating temperature should be higher than the boiling point of the convective additive; in the case where the convective additive is of a type that generates bubbles when decomposing upon heating, the heating temperature should be higher than the heating-decomposing temperature of the convective additive. It should be noted that the resin composition generally is required to have been in a fluidizable state at least when bubbles are generated by the foregoing heating. "In the heating step, convection is generated in the resin composition mainly by bubbles generated from the convective additive" has a meaning that also implies that "the resin composition has been in a fluidizable state at least when bubbles are generated by the foregoing heating" as described above. Then, "have been in a fluidizable state when bubbles are generated by heating" implies that the resin composition may be in a fluidizable state since before bubbles are generated by heating. For example, to explain it by referring to a few examples, the foregoing phrase implies (a) a resin is in a liquid state or a mucoid state at a stage prior to the hardening of the resin by heat setting, photo (UV) curing, or another hardening method, whereby the resin composition is fluidizable even in a state in which a conductive substance and a convective additive have been added thereto; (b) even if a resin itself before being hardened is solid or powdery, a liquid-form convective additive is added thereto, or a solvent or the like is added thereto, whereby the resin composition is fluidizable even in a state in which a conductive substance and a convective additive have been added further; and (c) though a resin before being hardened is solid or powdery and is not fluidizable even after a conductive substance and a convective additive are added further thereto, a resin composition becomes fluidizable when the resin is molten by heating (in this case, the heating temperature is higher than a boiling point or a decomposition point of the convective additive and higher than a temperature at which the resin composition can be fluidizable). In short, the resin composition can be anything as long as the resin composition is allowed to have convection mainly by bubbles generated from the convective additive in the heating step.

Next, as shown in FIG. 1C, the heating causes bubbles 107 to be generated from the convective additive 112 in the resin composition 106 between adjacent terminals, thereby causing convection in the resin composition 106, which accelerate the movement of the conductive substance 105 dispersed in the resin composition 106. The resin composition 106 containing the conductive substance 105 is squeezed out by pressure of the bubbles 107 thus generated, onto each terminal side face in a self-assembly manner, and the conductive substance 105 in the resin composition 106 in the self-assembly state accumulates so as to cover side faces of the terminals, as shown in FIG. 1D. The accumulations of the conductive substance 108 on each terminal side face come into contact with each other, whereby the connection terminals 102 and the electrode terminals 104 are connected electrically with each other. Here, since the conductive substance 105 that have been present in the resin composition 106 accumulates on side faces of the terminals now, the resin composition 106 no longer contains the conductive substance 105, and the adjacent terminals are insulated from each other. (It should be noted that in the present invention, "the conductive substance accumulates in a self-assembly manner" means that a plurality of particles of the conductive substance that are dispersed in a resin composition move so as to approach one another, thereby coming into contact and adhering to one another.)

Thereafter, further, the resin composition 106 remaining between adjacent terminals is cured or solidified by heating, irradiation with light (irradiation with ultraviolet rays), cooling, or another means according to the type of the resin used or the like. (Considering a thermoplastic resin, most of the thermoplastic resins are not cured by heat, unlike thermosetting resins or heat-resistant resins such as polyimide-based resins. Therefore, in the above description, the term "solidified" is used so as to refer to cases including, for example, a case where a molten thermoplastic resin is cooled, thereby losing fluidity and becoming solidified. Hereinafter, however, the term "harden" is used so as to generally refer to the concept including the solidification.)

To harden the resin composition 106, in the case where the resin in the resin composition 106 is a thermosetting resin, the resin composition 106 may be heated to above a temperature at which the resin composition 106 is hardened, and after being hardened, the resin composition 106 may be cooled by forced cooling or natural cooling. With the hardened resin composition 109, the connection electrodes 102 and the electrode terminals 104 opposed to each other are bonded or fixed with electric conduction via the conductive substance 108 being maintained therebetween. Therefore, the electric connection and mechanical bonding of the second plate body 103 to the first plate body 101 is secured further. Thus, the package 10 in which the second plate body 103 is mounted on the first plate body 101 can be obtained.

Here, a conventional general flip-chip mounting method further requires the step of injecting an insulation resin (so-called underfill material) between a semiconductor chip and a wiring board after the semiconductor chip is mounted on the wiring board, in order to fix the semiconductor chip on the wiring board. On the other hand, in the case of Embodiment 1, the first plate body 101 and the second plate body 103 are bonded or fixed by hardening the resin composition 106 left therebetween, like the case with use of the underfill. Therefore, in Embodiment 1, the step of injecting an underfill material or the like is not needed particularly, and this step can be omitted. Thus, the problem such as an increase in the process steps or a decrease in the yield can be avoided. It should be noted that the second plate body 103 may be fixed to the first plate body 101 by injecting an underfill material (not shown) into a gap between the first and second plate bodies and hardening the same as required.

The characteristic of this package 10 and the packaging method for the same lies in that after the first and second plate bodies 101 and 103 are arranged so that the connection terminals 102 of the first plate body 101 and the electrode terminals 104 of the second plate body 103 are opposed to each other, the resin composition 106 containing the conductive substance 105 and the convective additive 112 is supplied thereto, and bubbles 107 are generated from the convective additive 112 so as to cause the conductive substance 105 to accumulate on each terminal side face. In other words, between the first and second plate bodies 101 and 103, the bubbles 107 generated from the convective additive 112 contained in the resin composition 106 cause convection in the resin composition 106, whereby the conductive substance 105 in the resin composition 106, forced to shift to the self-assembly state in the vicinities of side faces of the terminals, is caused to accumulate on each terminal side face. By so doing, the electric connection between the opposed terminals can be achieved, with the insulation between adjacent terminals being maintained. Since electric conduction is achieved on each terminal side face, there is no need to form bumps between the opposed terminals. Thus, it is possible to prevent the problem of variations in bump height from occurring. Further, an economic effect that only a smaller amount of a material for the conductive substance 105 is needed can be achieved. Still further, since there is no need to melt the conductive substance 105 and hence the heating temperature can be lowered, damage to the first and second plate bodies 101 and 103 caused by the heating can be reduced. Still further, since an oxide film removing agent for removing oxide films on surfaces of portions of the conductive substance, which is added upon the melting, is not necessarily needed, the following features also are provided: adverse effects to reliability such as the corrosion of the conductive substance and the deterioration of insulation resistance of the plate bodies, which are caused by residues of an oxide film removing agent, can be avoided; and the cleaning step for removing residues of an oxide film removing agent can be omitted.

In a connection structure of the connection terminals of the first plate body and the connection terminals of the second plate body, between side faces of connection terminals adjacent to each other in the direction of planes of the plate bodies, a concentration gradient of the conductive substance occurs, which is such that the concentration of the conductive substance is high in the vicinities of the side faces of the connection terminals, and is low in areas farther from the side faces of the connection terminals. It should be noted that such a concentration gradient occurs in the same manner in the other embodiments described later, too.

Figure 3:
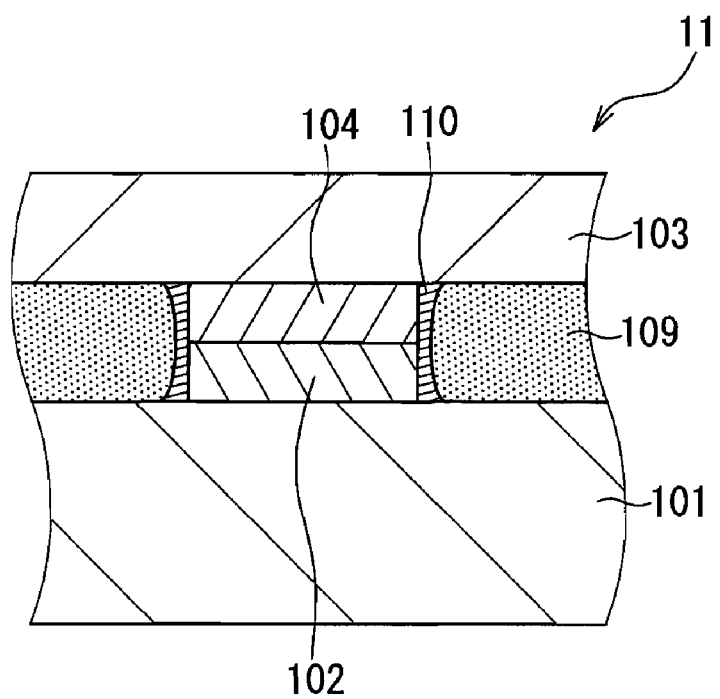
FIG. 3 is an enlarged cross-sectional view of a part of a modification of the package according to Embodiment 1 of the present invention.

Next, details of the structure of the package 10 according to Embodiment 1 and modifications of the package 10 according to Embodiment 1 are described, with reference to FIGS. 2 and 3. In FIG. 3, "110" denotes a conductive substance 108 that is solidified after having been molten once.

FIG. 2 is an enlarged cross-sectional view of a part of the package 10 according to Embodiment 1, which shows a state in which the conductive substance 105 accumulates on side faces of the connection terminal 102 and the electrode terminal 104 (accumulated conductive substance 108), which is an enlarged cross-sectional view obtained by enlarging a part of FIG. 1D regarding one pair of the connection terminal 102 and the electrode terminal 104 among the plurality of the same and the vicinities of the foregoing pair. In FIG. 2, the connection terminal 102 and the electrode terminal 104 are connected electrically via the conductive substance 108 accumulated on each terminal side face. Regarding the gap between the first and second plate bodies 101 and 103, the resin composition 106 remaining therein is hardened (hardened resin composition 109), or an underfill is injected therein and hardened, whereby the fixation is achieved and the insulation is maintained by the resin composition 109. "109" denotes a hardened resin composition, and in this state, the conductive substance is accumulated on each terminal side face of the connection terminals 102 and the electrode terminals 104. Therefore, the insulation between adjacent terminals is maintained. Still further, as shown in FIG. 3, a package 11 in which the second plate body 103 is mounted on a substrate 101 that is the first plate body can be obtained through the following process: a substance having a melting point lower than the temperature of heating applied in the producing process is used as the conductive substance 108 accumulated on each terminal side face, or the package 10 after completion of electric connection and sealing is heated continuously until the temperature exceeds the melting point of the conductive substance 108, so that the accumulated conductive material 108 is molten and subsequently solidified, whereby a connection body of the molten-solidified conductive substance 110 is formed on each terminal side face. Thus, by melting the accumulated conductive substance 108 (with the molten-solidified conductive substance 110), connection with further lower resistance can be realized.

It should be noted that when the conductive substance 105 is molten in a step of the producing process, the conductive substance 105 may be molten partially when accumulated on each terminal side face, or alternatively, the melting may starts when the conductive substance 105 has been accumulated already on each terminal side face. In the case where the conductive substance is thus molten, regarding this conductive material, of course, a metal material that can be molten at a relatively low temperature, such as solder, is used as a metal material to constitute the molten portion, so that damage occurring to the connection structure to be obtained, caused by heat necessary to melt the conductive substance, should be reduced.

The package 11 thus produced has high reliability since the portion fixing the first plate body 101 and the second plate body 103 forms a connection structure, thereby having flexibility and having a function of reducing stress such as thermal shock. Further, since the electric connection is achieved by metal junction obtained by melting and solidifying the conductive substance 108 (molten-solidified conductive substance 110), a strong connection state can be maintained. Still further, on side faces of the conductive substance 110, the resin composition 106 or the underfill material remaining thereon is hardened (hardened resin composition 109), and this has a stress reducing function against thermal stress of the conductive substance 110, and a function of suppressing plastic deformation occurring to the conductive substance 108; therefore, a package with extremely high reliability can be obtained.

It should be noted that FIG. 3 shows a state in which the entirety of the conductive substance 108 is molten and then solidified (molten-solidified conductive substance 110), but the state of the package 11 in a modification of Embodiment 1 is not limited to the state in which the conductive substance is molten-solidified. For example, the following states also fall in the scope of the present invention: a state in which only a part of the conductive substance 108 was not molten; and a state in which only a surface of the conductive substance 108 is molten and then solidified, and a metal junction is provided at interfaces between portions of the conductive substances 108 or between the conductive substance 108 and each terminal side face. The state also may be such that the molten conductive substance 108 (110) is wetly spread through interstices between top faces of the connection terminals 102 and the electrode terminals 104 in contact with each other.

It should be noted that FIG. 1 shows a case of a preferred embodiment in which the conductive substance accumulates on every side face of the terminals provided on the plate bodies; however, all the terminals on the plate body do not necessarily have a structure as shown in an enlarged cross-sectional view of FIG. 2 or 3, but only a part of the terminals may have the structure of the present invention.

Further, a second conductive substance (not shown) preliminarily may be supplied to either the connection terminals 102 or the electrode terminals 104 prior to the step of arranging the electrode terminals 104 of the second plate body 103 so as to be opposed to the connection terminals 102 of the first plate body 101, and the second conductive substance may have a melting point different from that of the first conductive substance 105.

Still further, regarding the material shape and the structure of the second conductive substance before being subjected to a melting and solidifying treatment, the second conductive substance may be a substance containing at least any of metal particles, solder particles, metal particles plated with solder or metal, and resin particles plated with solder or metal, like the first conductive substance described above.

Still further, in order to accumulate the conductive substance 105 efficiently on each terminal side face, for example, any of the following steps may be performed additionally: a step of irradiating each terminal side face with UV or plasma so as to increase the wettability of the terminal surfaces with the conductive substance 105; a step of changing the form of the conductive substance 105 or each terminal side face (for example, roughening the surfaces, pebbling the surfaces, etc.), or modifying surfaces by forming functional thin films (for example, charging surfaces positively, making surfaces hydrophilic, etc.), whereby the reactivity, selectivity, and energy stability between the conductive substance 105 and the terminal surfaces are enhanced utilizing physical and chemical actions such as electrostatic interaction and metal affinity; and, in some cases, a step of causing ultrasonic vibration, generating bubbles from the first plate body, or rotating the first plate body at a high speed so as to improve the dispersibility or movability of the conductive substance 105, thereby increasing the contact probability of the conductive substance 105 with each terminal side face.

Embodiment 2

The following describes a package 12 and a packaging method thereof according to Embodiment 2, as an embodiment of the connection structure and the method of producing the same of the present invention, while referring to FIGS. 4, 5, and 6. It should be noted that regarding constituent elements employed in Embodiment 2, if constituent elements like those of Embodiment 1 described above are employed, these constituent elements can achieve effects identical to the effects achieved by the corresponding constituent elements of Embodiment 1 described above, respectively. Therefore, if these constituent elements are identical to those of Embodiment 1, duplicate detail descriptions are omitted in some cases.

Figure 4A:
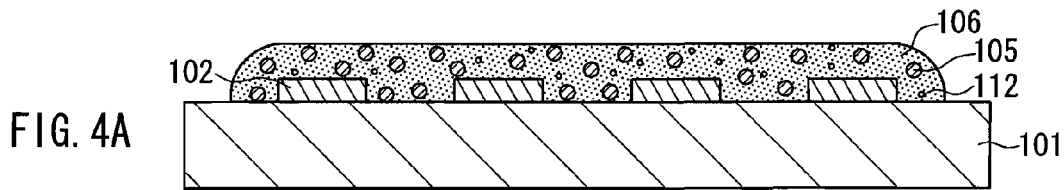
FIGS. 4A to 4E are schematic cross-sectional views showing a process, for explaining a package and a packaging method according to Embodiment 2 of the present invention.
Figure 4B:
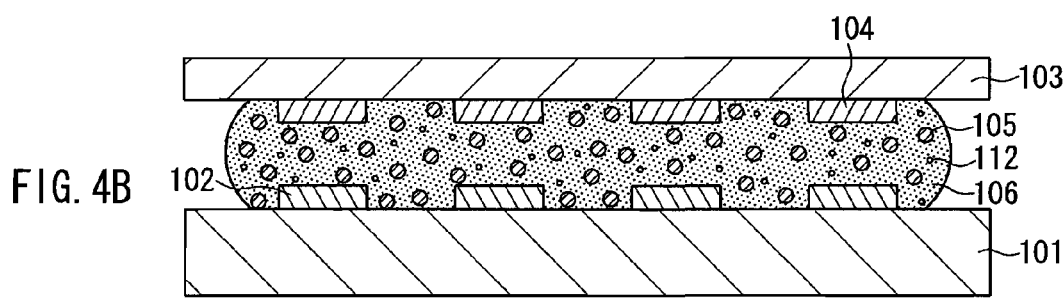
Figure 4C:
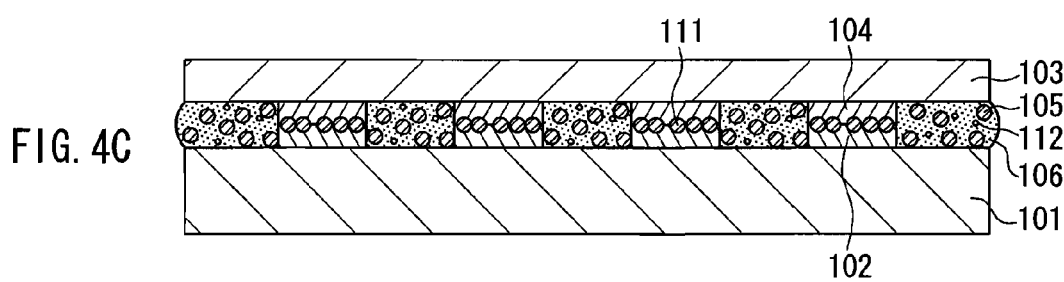
Figure 4D:
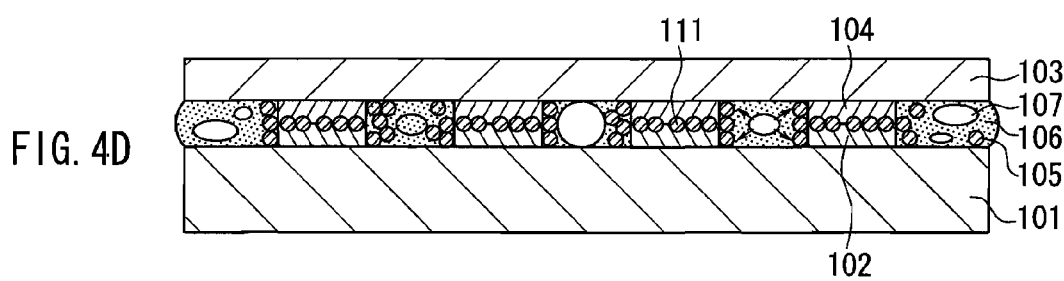
Figure 4E:
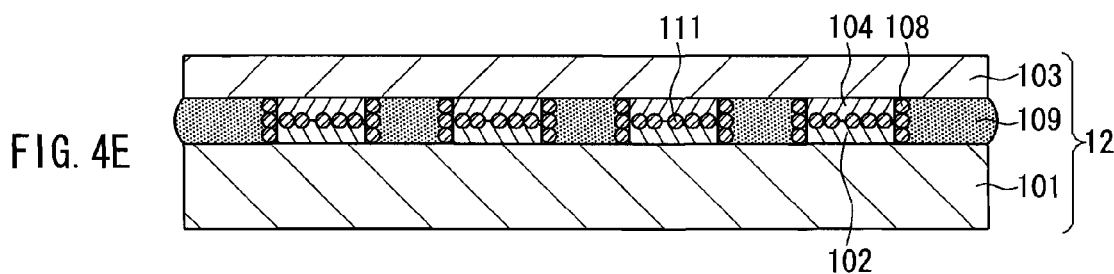

FIGS. 4A to 4E are schematic cross-sectional views of principal steps for producing the package 12 and a state of the same upon completion according to Embodiment 2. In FIGS. 4C to 4E, "111" denotes a conductive substance 105 interposed and embedded between top faces of connection terminals 102 and electrode terminals 104. The package 12 according to Embodiment 2 has a configuration such that electric connection is provided by a conductive substance 111 interposed between top faces of the connection terminals 102 and the electrode terminals 104 as well as a conductive substance 108 accumulating on each terminal side face.

First, as shown in FIG. 4A, a resin composition 106 containing the conductive substance 105 and a convective additive 112 is supplied onto a first plate body 101 on which a plurality of the connection terminals 102 are formed. It should be noted that an identical effect can be achieved by applying the resin composition 106 over the second plate body 103 preliminarily. In FIG. 4A, the resin composition 106 is shown as a paste-like resin composition, but the resin composition 106 in Embodiment 2 is not limited to this configuration, and it may be a resin composition in a sheet form or in a gel form, for example.

Next, as shown in FIG. 4B, in a state in which the resin composition 106 is supplied onto the first plate body 101, the second plate body 103 having a plurality of the electrode terminals 104 immediately is brought into contact with the surface of the resin composition 106. Here, the electrode terminals 104 of the second plate body 103 is arranged so as to be opposed to the connection terminals 102 of the first plate body 101.

Next, as shown in FIG. 4C, the second plate body 103 having the electrode terminals 104 opposed to the connection terminals 102 of the first plate body 101 is pressed with a pressure at a certain constant level toward the first plate body 101, and is kept so as to have a state such that the conductive substance 105 dispersed in the resin composition 106 is sandwiched between top faces of the connection terminals 102 and the electrode terminals 104. The connection terminals 102 and the electrode terminals 104 are connected electrically via the conductive substance 111 sandwiched between the terminal top faces. Here, the pressure applied to the second plate body 103 for sandwiching the conductive substance 105 between the opposed terminals may be at a level such that the distance between the opposed terminals is fixed to not more than the particle diameter of the conductive substance 105, and does not have to be at a level such that the conductive substance 111 becomes embedded in top faces of the terminals. Alternatively, the pressure may be at a level such that the distance between the opposed terminals is fixed so that a plurality of conductive substances interposed between the opposed terminal top faces are sandwiched therebetween in a state of being in contact with each other. In this state, the resin composition 106 is heated.

Next, as shown in FIG. 4D, the heating causes bubbles 107 to be generated from the convective additive 112 in the resin composition 106 between adjacent terminals, thereby causing convection in the resin composition 106, which accelerates the movement of the conductive substance 105 dispersed in the resin composition 106. The resin composition 106 containing the conductive substance 105 is squeezed out by pressure of the bubbles 107 thus generated, onto each terminal side face in a self-assembly manner, and the conductive substance 105 in the resin composition 106 in the self-assembly state accumulates so as to cover each terminal side face, as shown in FIG. 4E. The accumulations of the conductive substance 108 on the side faces of the terminals come into contact with one another, whereby the connection terminals 102 and the electrode terminals 104 are connected electrically with each other. Thus, in the package 12 according to Embodiment 2, the first and second plate bodies 101 and 103 are connected electrically via the conductive substance 111 sandwiched between terminals top faces, and via the conductive substance 108 accumulated on each terminal side face. At the same time, the adjacent terminals are insulated from each other since the conductive substance 105 in the resin composition 106 accumulates on each terminal side face, whereby the resin composition 106 interposed between the adjacent terminals no longer contains the conductive substance 105.

Thereafter, further, the resin composition 106 remaining between adjacent terminals is hardened by heating, irradiation with light (irradiation with ultraviolet rays), cooling, or another means according to the type of the resin used or the like. With the hardened resin composition 109, the connection electrodes 102 and the electrode terminals 104 are bonded or fixed with electric conduction via the conductive substance 111 and the conductive substance 108 being maintained therebetween. Therefore, the electric connection and mechanical bonding of the second plate body 103 to the first plate body 101 can be secured further. Thus, the package 12 in which the second plate body 103 is mounted on the first plate body 101 can be obtained.

In Embodiment 2, unlike Embodiment 1, by applying the resin composition 106 over surfaces of the first plate body 101 and the connection terminals 102 preliminarily, the step of injecting and filling the resin composition 106 into the gap between the first and second plate bodies 101 and 103 can be omitted. Therefore, restrictions such as a viscosity are reduced, and the range of selectable materials can be expanded. Further, there is also a difference from Embodiment 1 in that when the second plate body 103 is pressed against the first plate body 101, the conductive substance 105 (111) is interposed between the connection terminals 102 and the electrode terminals 104, whereby electric connection with low resistance is achieved between the opposed terminals.

The characteristic of this package 12 and the packaging method for the same lies in that after electric conduction is ensured between the opposed terminals by pressing the second plate body 103 so as to sandwich the conductive substance 105 between the terminal top faces, the conductive substance 105 not involved in conduction is accumulated on each terminal side face by the bubbles 107 generated from the convective additive 112. In other words, electric conduction between the opposed terminals has been achieved already by sandwiching the conductive substance 105 between top faces of the connection terminals 102 and the electrode terminals 104, and in this state, additionally, the bubbles 107 generated from the convective additive 112 contained in the resin composition 106 cause convection in the resin composition 106, thereby forcibly accumulating the conductive substance 105 in the resin composition 106 remaining between the adjacent terminals onto each terminal side face. As a result, the conductive substance 105, which could cause short circuits when remaining between the adjacent terminals, is removed therefrom, whereby the insulation is enhanced, and at the same time, the opposed terminals are connected electrically via the thus formed accumulations of the conductive substance 108. Thus, in Embodiment 2, further excellent electric connection with high reliability is obtained.

By so doing, the package 12 can be obtained in which both of the insulation between the adjacent terminals and the stable electric connection between the opposed terminals are realized at the same time.

In the previous description, a preferred embodiment was referred to in which the electric connection between the opposed terminals is to be achieved by accumulating the conductive substance 105 on each terminal side face, but here, the electric conduction has been achieved already by sandwiching the conductive substance 105 between top faces of the terminals, and further excellent electric connection with high reliability can be achieved via the accumulated conductive substance 108 on each terminal side face.

Next, details of the structure of the package 12 according to Embodiment 2 and modifications of the package 12 according to Embodiment 2 are described, with reference to FIGS. 5A to 5B and 6A to 6D.

Figure 5A:
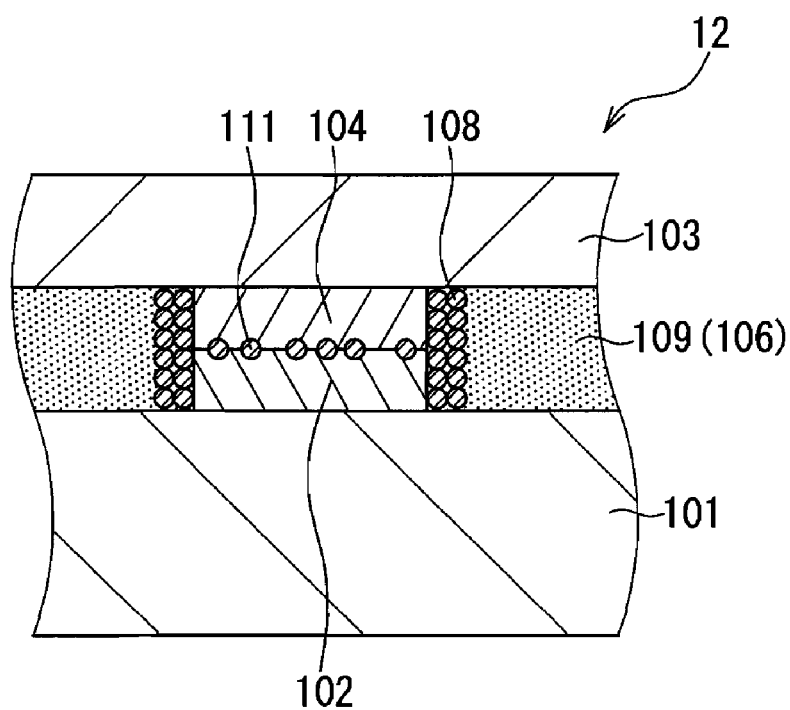
FIG. 5A is an enlarged cross-sectional view of a part of a package according to Embodiment 2 of the present invention.

FIG. 5A is an enlarged cross-sectional view of a part of the package 12 according to Embodiment 2, which shows a state in which the conductive substance 105 is sandwiched between top faces of the connection terminals 102 and the electrode terminals 104 so as to be embedded therein, the remainder conductive substance is accumulated on each terminal side face owing to the convective additive 112, and the resin composition 106 interposed in a gap between the first and second plate bodies 101 and 103 is hardened. In FIG. 5, the connection terminals 102 and the electrode terminals 104 are connected electrically by the conductive substance 111 sandwiched therebetween so as to be embedded in top faces of the terminals, and at the same time, further electric connection is provided by powder-like conductive substance 108 accumulated on each terminal side face in a subsequent step, whereby stable electric conduction with low resistance is achieved. Besides, the first and second plate bodies 101 and 103 are fixed by the hardened resin composition 109, by hardening the resin composition 106 remaining in the gap therebetween, which no longer contains the conductive substance 105, or by injecting and hardening an underfill material into the gap. Therefore, the assured mechanical support of the first and second plate bodies 101 and 103 and the reliable insulation between adjacent terminals are maintained.

Figure 5B:
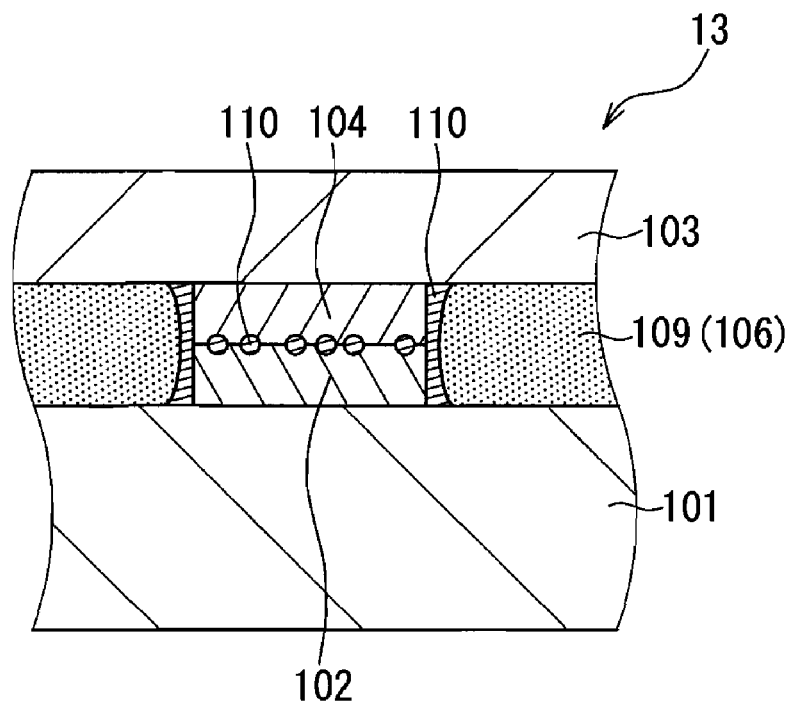
FIG. 5B is an enlarged cross-sectional view of a part of the package shown in FIG. 5A, which shows a state in which the conductive substance sandwiched between terminal top faces so as to be embedded therein and the conductive substance accumulated on each terminal side face are molten and solidified.

Further, FIG. 5B is an enlarged cross-sectional view of a part of the package 12 shown in FIG. 5A, which shows a state in which the conductive substance 111 sandwiched between terminal top faces so as to be embedded therein and the conductive substance 108 accumulated on each terminal side face are molten and then solidified. A conductive substance having a melting point lower than the temperature applied to the above-described producing process is used as the conductive substance 111 sandwiched between the terminal top faces so as to be embedded therein and the conductive substance 108 accumulated on each terminal side face, or alternatively, the package 12 after completion of electric connection and sealing is heated to above the melting point of the conductive substance 105 (108, 111). By so doing, the embedded conductive substance 111 and the accumulated conductive substance 108 are molten and subsequently solidified, whereby the molten-solidified conductive substance 110 is formed on each terminal top face and each terminal side face. Thus, the package 13 in which the second plate body 103 is mounted on the first plate body 101 is obtained, and the electric connection with further lower resistance and higher reliability can be realized.

Figure 6A:
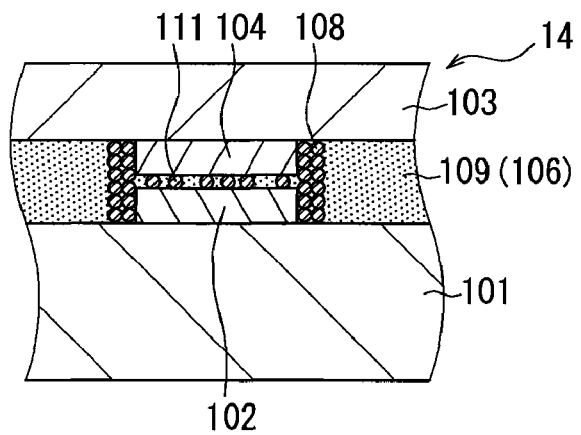
FIGS. 6A to 6D are enlarged cross-sectional views of parts of modifications of the package according to Embodiment 2 of the present invention, respectively.

Next, FIG. 6A is an enlarged cross-sectional view of a part of a package 14, which shows a state in which the conductive substance 105 contained in the resin composition 106 is sandwiched between top faces of the connection terminals 102 of the first plate body 101 and the electrode terminals 104 of the second plate body 103 to an extent such that the conductive substance 105 is not embedded in the top faces (sandwiched conductive substance 111), the conductive substance 105 remaining between adjacent terminals are accumulated on each terminal side face (conductive substance 108 accumulated on side faces of connection terminals and electrode terminals opposed to each other), and the resin composition 106 interposed in a gap between the first and second plate bodies 101 and 103 is hardened (hardened resin composition 109). Here, since the conductive substance 105 present in the resin composition 106 is accumulated on each terminal side face, the hardened resin composition 109 does not contain the conductive substance 105, whereby the insulation is maintained between the adjacent terminals.

Figure 6B:
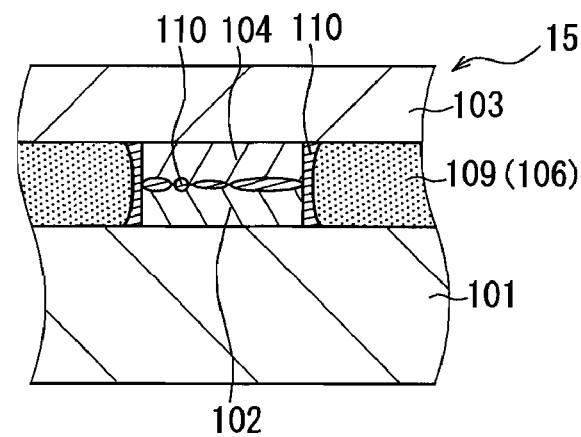
Figure 6C:
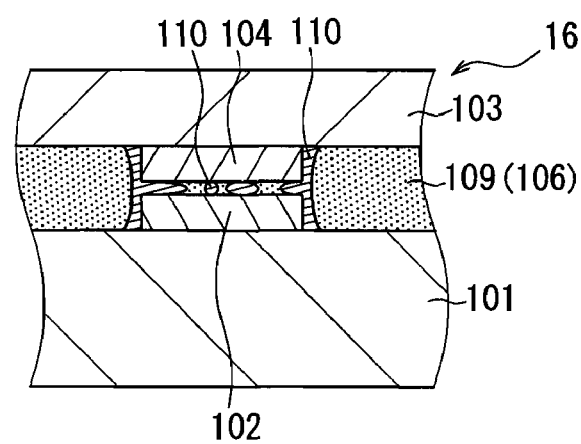
Figure 6D:
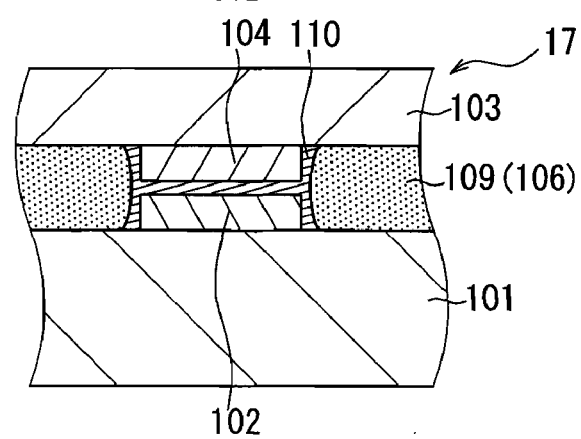

FIGS. 6B, 6C, and 6D are partial enlarged cross-sectional views for explaining modifications of the above-described embodiment. FIG. 6B showing a package 15 and FIG. 6C showing a package 16 are enlarged cross-sectional views showing parts of packages as modifications of the packages 12 and 14, respectively, in a state in which the conductive substance 108 accumulated on each terminal side face and the conductive substance 111 interposed between the opposed terminals are molten, spread by wetting over each terminal top face or each terminal side face, and solidified (molten-solidified conductive substance 110). A conductive substance having a melting point lower than the temperature applied to the above-described producing process is used as the conductive substance 111 sandwiched between the terminal top faces so as to be embedded therein or sandwiched so as not to be embedded therein, and the conductive substance 108 accumulated on each terminal side face; or alternatively, each of the package 12 and the package 14 after completion of electric connection and sealing is heated to above the melting point of the conductive substance 105 (108, 111). By so doing, the embedded conductive substance 111 and the accumulated conductive substance 108 are molten, spread by wetting over the terminal faces, and subsequently solidified, whereby the molten-solidified conductive substance 110 is formed on each terminal top face and each terminal side face. Thus, the package 15 and the package 16 in which the second plate body 103 is mounted on the first plate body 101 can be obtained. Here, these view show the cases where the conductive substance 108 accumulated on each terminal side face and the conductive substance 111 interposed between the opposed terminals are molten, spread by wetting, and solidified, but the state may be such that the entirety of the conductive substance 108, 111 present between the opposed terminals or on each terminal side face is completely molten, spread by wetting, and solidified; the state may be such that a part of the conductive substance 108, 111 is molten, spread by wetting, and solidified; or alternatively, the state may be such that only surfaces of the conductive substance 108, 111 is molten, spread by wetting, and solidified, and metal junction is formed at interfaces thereof. The package 15, 16 is not limited by the molten-solidified state of the molten-solidified conductive substance 110, 111.

It should be noted that it is possible to increase the wetting spreadability of the conductive substance 105 over each terminal top face or side face by performing a step such as those described at the end of the Embodiment 1 section for efficiently accumulating the conductive substance on each terminal side face in Embodiment 1, or by varying the weight percentage of the added oxide film removing agent or convective additive with respect to the resin composition, or by varying conditions such as the heating temperature or heating time.

Further, the state may be such that only a part or an entirety of the conductive substance 111 present between the opposed terminals is molten, and the conductive substance 108 accumulated on each terminal side face is not molten. The conductive substance 111 sandwiched between the opposed terminals has an increased wetting spreadability upon heating since surface oxide films covering the conductive substance tend to be broken due to pressure from terminal top faces. Therefore, a connection structure can be produced in a state in which only a part or an entirety of the conductive substance 111 present between the opposed terminals is molten while the conductive substance 108 accumulated on each side face is not molten.

FIG. 6D is an enlarged cross-sectional view showing a part of a package 17 in a state in which the conductive substance 108, 111 present between the opposed terminals or on each terminal side face is molten, integrated, and solidified. In other words, the foregoing conductive substance is the conductive substances 108 and 111 in FIG. 6C having been molten, integrated, and solidified. It should be noted that when the conductive substance is molten, integrated, and solidified, in order to increase the wetting spreadability of the conductive substance over each terminal top face and side face, a step such as those described at the end of the Embodiment 1 section may be performed, or an amount of the resin composition 106 applied over the plate body 101 is adjusted so as to be suitable for conditions such as the height (thickness) of each terminal, the distance between the opposed terminals, and the average particle diameter of the conductive substance, whereby the package 17 can be produced.

The average particle diameter of the conductive substance 105 in the powder form to be used in the present invention varies with the respective heights (thicknesses) of the connection terminals 102 and the electrode terminals 104, the area sizes of the opposed faces, the pitches of the connection terminals and the electrode terminals, etc., and hence, it cannot be specified generally. However, usually the conductive substance 105 having an average particle diameter in a range of 0.1 µm to 100 µm is used preferably, and that in a range 5 µm to 30 µm is used more preferably. The respective heights (thicknesses) of the connection terminals 102 and the electrode terminals 104 are preferably 1 µm to 70 µm, and more preferably 5 µm to 35 µm, but it can be adjusted appropriately according to the average particle diameter of the used conductive substance. The distance between the opposed terminals is preferably 0 µm to 100 µm, and can be adjusted appropriately according to the respective heights of the terminals, the particle diameter of the conductive substance, etc.

As a matter of course, since the conductive substance having a specific average particle diameter as described above or used in Examples described below has a particle size distribution, particles having larger or smaller diameters than the above-specified average particle diameter are contained in the conductive substance. Therefore, when the plate bodies are pressed, among the conductive substance particles, some particles may be embedded in top faces of the terminals, some particles may be sandwiched or crushed by the top faces of the opposed terminals, and some particles may maintain the state of being interposed between the opposed terminals.

Further, in FIGS. 4, 5, and 6, the conductive substance sandwiched between the opposed terminals or embedded therein are shown as being in a state in which particles thereof are aligned one by one in the horizontal direction, but as a matter of course, between the opposed terminal top faces, two or more particles of the conductive substance aligned in the vertical direction may be interposed, either in a sandwiched state or an embedded state, or the conductive substance may be interposed therebetween in a crushed state. Of course, the conductive substance accumulated on the side faces is not limited to a state in which particles are aligned one by one in the vertical direction.

Further, in order to accumulate the conductive substance 105 more efficiently on each terminal side face, the contact probability of the conductive substance with respect to each terminal side face may be increased by the following design, in addition to the steps as those used in Embodiment 1 described above: setting the sum of the heights (thicknesses) of the respective opposed terminals to a level greater than the distance between the opposed terminals; or setting the distance between the opposed terminals to a level smaller than the average particle diameter of the conductive substance.

It should be noted that regarding the average particle diameter of the conductive substance, the particle size distribution of the powdery body thereof is determined by converting a scattered light intensity distribution measured by laser light scattering, and the measurement was performed using a laser diffraction particle size analyzer (SALD-3000J, manufactured by Shimadzu Corporation).

The packages 15, 16, and 17 thus produced have high reliability since the portion fixing the first plate body 101 and the second plate body 103 has flexibility and has a function of reducing stress owing to thermal shock or the like. Further, since the electric connection is achieved by metal junction obtained by melting and solidifying the conductive substance 108 (molten-solidified conductive substance 110), a strong connection state can be maintained. Still further, the conductive substance is spread by wetting through gaps between the top faces of the opposed terminals and over each side face and is integrated, effects of resistance reduction and reliability enhancement of the connection parts can be achieved. Still further, since the resin composition 106 remaining thereon or the underfill material is hardened (hardened resin composition 109) on side faces of the conductive substance 110, it has a stress reducing function against thermal stress of the conductive substance 110, and a function of suppressing plastic deformation occurring to the conductive substance 108; thus, a package with extremely high reliability can be obtained.

So far the present invention has been described with reference to preferred embodiments, but these matters described above are not limiting matters, but the invention may be varied in many ways.

As a resin composition containing a conductive substance and a convective additive, a thermosetting resin is described as an example, but a heat-resistant resin, a thermoplastic resin, a photo-curing resin, or a resin of these in combination, which are resins other than the foregoing thermosetting resin, may be used.

Here, examples of the thermosetting resin include, for example, epoxy resins, phenol resins, cyanate resins, polyphenylene ether resins, and a mixture of these.

Examples of the heat-resistant resin include, for example, polyimide resins, polyamide-imide resins, and aromatic polyamide resins.

Examples of the photo-curing resin include, for example, radical polymerizable resins, and cation polymerizable resin. Examples of the radical polymerizable resin include acrylic oligomers such as polyester acrylate, urethane acrylate, and epoxy acrylate; unsaturated polyester; enthiol; and resins based on compounds of the same. Examples of the cation polymerizable resin include epoxy resins such as glycidyl ether resins and alicyclic epoxy resins; oxetane resins; vinyl ether resins; and resins based on compounds of the same. Examples of the thermoplastic resin include, for example, polyethylene, polypropylene, polystyrene, acrylonitrile/methacryl resin, and vinyl chloride resin.

Further, regarding the convective additive in each embodiment of the present invention, examples of the same include decomposed-type convective agents such as sodium hydrogencarbonate, ammonium methaborate, aluminum hydroxide, dawsonite, and barium metaborate; and boiling/vaporizing-type convective agents such as butyl carbitol, flux, isobutyl alcohol, xylene, isopentyl alcohol, butyl acetate, tetrachlorethylene, methyl isobutyl ketone, ethyl carbitol, butyl carbitol, and ethylene glycol, which are medium-melting-point or high-melting-point solvents.

To facilitate the understanding of the present invention, the present invention is described below with reference to Examples, though the present invention is not limited to Examples described below.

EXAMPLE 1

A connection structure (package 10) according to Embodiment 1 described above with reference to FIGS. 1A to 1D and 2 was produced.

The first and second plate bodies 101 and 103 in FIG. 1 referred to in conjunction with Embodiment 1 described above were formed as follows: the first plate body 101 was formed with a four-layer-wiring resin multilayer substrate having an Interstitial Via Hole (IVH) structure in all layers, that is, an "ALIVH" substrate (produced by Panasonic Electronic Devices Co., Ltd.); and, a semiconductor chip (a silicon memory semiconductor with a thickness of 0.3 mm and a size of 10 mm×10 mm, having electrode terminals 104 having identical sizes to those of the connection terminals 102 of the first plate body 101, at positions opposed to the connection terminals 102) used as the second plate body 103 was arranged to be opposed to a wiring layer (thickness: 12 µm, diameter: 50 µm, pitch: 100 µm, 352 terminals) that function as the connection terminals 102, in a part of a wiring pattern (not shown) on a copper foil-made top layer of the ALIVH substrate. For the connection terminals 102 and wiring patterns on the substrate 101, those plated with a metal such as nickel, gold, or the like were used.

As the conductive substance 105, Cu powder (average particle diameter: 5 µm [measured by a laser diffraction particle size analyzer], 10 wt % [based on the weight of the resin composition]) as metal particles was used. As the convective additive 112, isopropyl alcohol was used in an amount of 3 wt % [based on the weight of the resin composition]. As the resin of the resin composition 106, one-liquid epoxy resin was used in an amount of 87 wt % [based on the weight of the resin composition], and the mixing of the materials was carried out by stirring the materials using a kneader.

As shown in FIG. 1C, in order to generate the bubbles 107 from the convective additive 112 in the resin composition 106 between the adjacent terminals by heating so as to generate convection in the resin composition 106, heating at 160° C. was carried out for 20 seconds, whereby the conductive substance 105 in the resin composition 106 was accumulated to cover each terminal side face, as shown in FIG. 1D. Thereafter, heating at 150° C. was carried out for 10 minutes, so as to harden the epoxy resin.

The package 10 was produced by the foregoing method, and was tested for electric connection between the opposed connection terminals. As a result, initial connection was confirmed.

EXAMPLE 2

A connection structure (package 11) according to Embodiment 1 described above with reference to FIG. 3 was produced. In the production of the package 11 [see FIG. 3], solder powder (Sn-3.0Ag-0.5Cu, average particle diameter: 18 μm, 20 wt % [based on the weight of the resin composition]) as the metal particles as the conductive substance in the resin composition, a rosin-denatured flux (containing 32 wt % of glycol-based solvent, 5 wt % [based on the weight of the resin composition]) as the oxide film removing agent, isopropyl alcohol (3 wt % [based on the weight of the resin composition]) as the convective additive 112, and a one-liquid epoxy resin (72 wt % [based on the weight of the resin composition]) as the resin were used, and the mixing of the above-described materials was carried out by stirring using a kneader. In the foregoing heat melting, the heating was carried out by setting the heating temperature and the heating time for accumulating the conductive substance in the resin composition on each terminal side face to 230° C. and 30 seconds, respectively, so that the temperature exceeded the melting point of the solder powder used, i.e., 217° C. As to the other conditions, the same conditions as those in Example 1 for the package 10 according to Embodiment 1 were adopted.

The package 11 was produced by the foregoing method, and was tested for electric condition between the opposed connection terminals. As a result, initial connection was confirmed. Besides, it was detected that an initial connection resistance value at connected portions between the opposed connection terminals was lower as compared with the package 10.

EXAMPLE 3

A connection structure (package 12) according to Embodiment 2 described above with reference to FIGS. 4A to 4E and 5A was produced.

For the first plate body 101, the second plate body 103, the conductive substance 105, the resin composition 106, and the convective additive 112 used therein, the same as those used in Example 1 for the package 10 according to Embodiment 1 were used. As a method for applying the resin composition 106 formed with a mixture of the foregoing materials, the following method was used: a dispenser having a stirring function was used so as to prevent the dissociation of the resin composition 106, and a supplied amount was controlled so as to be constant. Here, in order to apply the resin composition uniformly over an entirety of the mounting area, the resin composition may be supplied thereto in a scanning manner, or may be dispensed in an appropriate shape (such as a star-like shape) at predetermined positions. Besides, when the plate body 103 was placed on the plate body 101 over which the foregoing materials were applied, these plate bodies were fixed so that the distance between the opposed terminals (102, 104) was 0, whereby the conductive substance 111 interposed between the opposed terminals was embedded in the top faces of the opposed terminals. It should be noted that regarding the heating temperature and the heating time for generating bubbles from the convective additive and generating convection in the resin composition so as to accumulate the conductive substance 105 on each terminal side face, the same conditions as those in Example 1 according to Embodiment 1 were adopted; and regarding the heating temperature and the heating time for hardening the epoxy resin, the same conditions as those in Example 1 according to Embodiment 1 were adopted.

The package 12 shown in FIG. 5A was produced by the foregoing method, and was tested for electric connection between the opposed connection terminals. As a result, initial connection was confirmed. Besides, it was detected that an initial connection resistance value at connected portions between the opposed connection terminals was lower as compared with the package 10.

EXAMPLE 4

A connection structure (package 13) according to Embodiment 2 described above with reference to FIGS. 4A to 4E and 5B was produced.

For the first plate body 101, the second plate body 103, the conductive substance 105, the resin composition 106, and the convective additive 112 used for producing the package 13 [see FIG. 5B], the same as those used in Example 2 for the package 11 were used. The application of the foregoing materials and the placement of the plate body 103 were performed in the same manner as that for Example 3 for the package 12, and the same conditions as those for Example 2 for the package 11 were adopted for the heating temperature and the heating time.

The package 13 shown in FIG. 5B was produced by the foregoing method, and was tested for electric connection between the opposed connection terminals. As a result, initial connection was confirmed. Besides, it was detected that an initial connection resistance value at connected portions between the opposed connection terminals was lower as compared with the package 12.

EXAMPLE 5

A connection structure (package 14) according to Embodiment 2 described above with reference to FIG. 6A was produced.

In the production of the package 14 [see FIG. 6A], when the plate body 103 was placed, the plate bodies were fixed so that the distance between the opposed terminals was equal to the average particle diameter of the conductive substance used, and the conductive substance 111 interposed between the opposed terminals was sandwiched therebetween in a manner such that the conductive substance 111 was not embedded in the top faces of the opposed terminals. It should be noted that regarding the conditions other than the plate bodies fixing method, such as the plate bodies, the materials, the method for applying the materials, and the heating time, the same conditions as those in Example 3 for the package 12 were adopted. Thus, the package 14 shown in FIG. 6A was produced, and was tested for electric connection between the opposed connection terminals. As a result, the initial connection was confirmed.

By arranging and fixing the plate bodies in a manner such that the conductive substance 111 interposed between the opposed terminals was not embedded in top faces of the opposed terminals, the pressure applied to the plate bodies can be minimized, whereby a problem such as damage to the plate bodies can be avoided.

INDUSTRIAL APPLICABILITY

With the present invention, it is possible to provide a connection structure useful for an electronic component package with high productivity and high reliability, which is applicable to flip-chip mounting of a next-generation narrower-pitched semiconductor chip, and a method of producing the same; and to a method of producing the foregoing connection structure.

The invention claimed is:

1. A connection structure, comprising:
   a first plate body on which a wiring pattern having a plurality of connection terminals is formed; and
   a second plate body having at least two connection terminals arranged so as to be opposed to the connection terminals of the first plate body,
   wherein
   the connection terminals of the first plate body and the connection terminals of the second plate body each are formed in a projection form, on a surface of the first plate body and a surface of the second plate body, respectively;
   a powder-like conductive substance is accumulated so as to cover at least a part of each side face of the opposed connection terminals of the first and second plate bodies, whereby the opposed connection terminals are connected electrically with each other by contact of particles of the powder-like conductive substance with each other, and
   the opposed connection terminals of the first and second plate bodies are in either a state (a) such that top faces of the connection terminals of the first and second plate bodies at least partially are in direct contact with each other, or a state (b) such that the powder-like conductive substance further is interposed at least partially between opposed top faces of the connection terminals of the first and second plate bodies.

2. The connection structure according to claim 1, wherein when the opposed connection terminals of the first and second plate bodies are in the state (a) such that the top faces of the connection terminals of the first and second plate bodies at least partially are in direct contact with each other, the powder-like conductive substance accumulated so as to cover at least a part of each side face of the opposed connection terminals of the first and second plate bodies is molten and solidified thereby forming connection bodies, so that the opposed connection terminals are connected electrically by the connection bodies.

3. The connection structure according to claim 1, wherein the powder-like conductive substance interposed between the opposed top faces of the connection terminals of the first and second plate bodies is embedded in parts of the top faces of the connection terminals of the first and second plate bodies.

4. The connection structure according to claim 1, wherein the powder-like conductive substance interposed between the opposed top faces of the connection terminals of the first and second plate bodies is sandwiched in parts of gaps between the top faces of the connection terminals of the first and second plate bodies.

5. The connection structure according to claim 1, wherein entire side faces of the opposed connection terminals of the first and second plate bodies are covered with the powder-like conductive substance.

6. The connection structure according to claim 1, wherein entire side faces of the opposed connection terminals of the first and second plate bodies are covered with connection bodies formed with the molten and solidified powder-like conductive substance.

7. The connection structure according to claim 1, wherein the first plate body is a plate body containing an inorganic filler and a thermosetting resin.

8. The connection structure according to claim 1, wherein the first plate body is a plate body containing
   at least one reinforcing material selected from a woven fabric of a glass fiber, a nonwoven fabric of a glass fiber, a woven fabric of a heat-resistant organic fiber, and a nonwoven fabric of a heat-resistant organic fiber, and
   a thermosetting resin composition impregnated in the reinforcing material.

9. The connection structure according to claim 1, wherein the first plate body is a plate body including a flexible board comprising a film and a wiring pattern.

10. The connection structure according to claim 1, wherein the second plate body is an active element.

11. The connection structure according to claim 1, wherein the second plate body is a semiconductor chip.

12. The connection structure according to claim 1, wherein the second plate body is either
    a plate body containing at least one reinforcing material selected from a woven fabric of a glass fiber, a nonwoven fabric of a glass fiber, a woven fabric of a heat-resistant organic fiber, and a nonwoven fabric of a heat-resistant organic fiber; and a thermosetting resin composition impregnated in the reinforcing material, or
    a plate body containing the inorganic filler and a thermosetting resin.

13. The connection structure according to claim 1, wherein the second plate body is a plate body including a flexible board comprising a film and a wiring pattern.

14. The connection structure according to claim 1, wherein the powder-like conductive substance contains at least one of metal particles made of a single metal composition, solder particles, metal particles plated with solder or metal, and resin particles plated with solder or metal.

15. The connection structure according to claim 1, wherein the powder-like conductive substance comprises two types of powder-like conductive substances.

16. The connection structure according to claim 1, wherein a resin or a resin composition is filled between the first plate body and the second plate body.

17. The connection structure according to claim 16, wherein the resin or the resin composition is made of a resin or a resin composition in a sheet form or a paste form.

18. A method of producing a connection structure in which a second plate body having, on its surface, at least two connection terminals each formed in a projection form is arranged so as to be opposed to a first plate body having, on its surface, a wiring pattern having a plurality of connection terminals each in a projection form, and the connection terminals of the first plate body and the connection terminals of the second plate body are connected electrically, the method comprising the steps of:
    (i) aligning the connection terminals of the first plate body and the connection terminals of the second plate body so that they are opposed to each other, so that opposed top faces of the connection terminals of the first plate body and the connection terminals of the second plate body are brought into contact with each other at least partially;

(ii) supplying a resin composition containing the powder-like conductive substance and the convective additive into a gap between the first plate body and the second plate body; and (iii) heating the resin composition, wherein in the heating step (iii), convection occurs in the resin composition owing to bubbles generated mainly from the convective additive, thereby causing at least a part of the powder-like conductive substance in the resin composition interposed between the adjacent connection terminals to accumulate in a self-assembly manner so as to cover at least a part of each side face of the opposed connection terminals, whereby the opposed connection terminals of the first and second plate bodies are connected electrically.

19. The method of producing a connection structure according to claim 18, wherein in the step (iii), the powder-like conductive substance accumulated so as to cover at least a part of each side face of the opposed connection terminals of the first and second plate bodies further is molten and solidified so as to form connection bodies, whereby the connection bodies electrically connect the connection terminals of the first plate body and the connection terminals of the second plate body with each other.

20. A method of producing a connection structure in which a second plate body having, on its surface, at least two connection terminals each formed in a projection form is arranged so as to be opposed to a first plate body having, on its surface, a wiring pattern having a plurality of connection terminals each in a projection form, and the connection terminals of the first plate body and the connection terminals of the second plate body are connected electrically, the method comprising the steps of:

(iv) supplying a resin composition containing the powder-like conductive substance and the convective additive over the first plate body;

(v) aligning the connection terminals of the first plate body and the connection terminals of the second plate body so as to sandwich the resin composition between the connection terminals of the first plate body and the connection terminals of the second plate body, and pressing the same so as to provide electric connection; and (vi) heating the resin composition, wherein in the heating step (vi), convection occurs in the resin composition owing to bubbles generated mainly from the convective additive, thereby causing at least a part of the powder-like conductive substance in the resin composition interposed between the adjacent connection terminals to accumulate in a self-assembly manner so as to cover at least a part of each side face of the opposed connection terminals, whereby the opposed connection terminals of the first and second plate bodies are connected electrically.

21. The method of producing a connection structure according to claim 20, wherein in the step (v), the powder-like conductive substance sandwiched between the opposed connection terminals of the first and second plate bodies is caused to be embedded in parts of the connection terminals of the first and second plate bodies.

22. The method of producing a connection structure according to claim 20, wherein in the step (vi), the powder-like conductive substance sandwiched between the opposed connection terminals of the first and second plate bodies is molten and solidified, thereby wetting at least parts of the top faces of the connection terminals of the first and second plate bodies.

23. The method of producing a connection structure according to claim 20, wherein in the step (vi), the powder-like conductive substance sandwiched between the opposed top faces of the connection terminals of the first and second plate bodies is molten and solidified, thereby wetting at least parts of the top faces of the connection terminals of the first and second plate bodies, and the powder-like conductive substance accumulated so as to cover at least a part of each side face of the connection terminals of the first and second plate bodies is molten and solidified thereby forming connection bodies, so that the connection terminals of the first plate body and the connection terminals of the second plate body are connected electrically with each other by the connection bodies.

24. The method of producing a connection structure according to claim 18, wherein the first plate body is either a plate body containing at least one reinforcing material selected from a woven fabric of a glass fiber, a nonwoven fabric of a glass fiber, a woven fabric of a heat-resistant organic fiber, and a nonwoven fabric of a heat-resistant organic fiber, and a thermosetting resin composition impregnated in the reinforcing material, or a plate body containing an inorganic filler and a thermosetting resin.

25. The method of producing a connection structure according to claim 18, wherein the first plate body is a plate body including a flexible board comprising a film and a wiring pattern.

26. The method of producing a connection structure according to claim 18, wherein the second plate body is an active element.

27. The method of producing a connection structure according to claim 18, wherein the second plate body is a semiconductor chip.

28. The method of producing a connection structure according to claim 18, wherein the second plate body is either a plate body containing at least one reinforcing material selected from a woven fabric of a glass fiber, a nonwoven fabric of a glass fiber, a woven fabric of a heat-resistant organic fiber, and a nonwoven fabric of a heat-resistant organic fiber, and a thermosetting resin composition impregnated in the reinforcing material, or a plate body containing an inorganic filler and a thermosetting resin.

29. The method of producing a connection structure according to claim 18, wherein the second plate body is a plate body including a flexible board comprising a film and a wiring pattern.

30. The method of producing a connection structure according to claim 18, wherein the convective additive is an additive that generates bubbles so as to cause convection in the resin composition when the resin composition is heated in the step (iii) or the step (vi).

31. The method of producing a connection structure according to claim 18, wherein the powder-like conductive substance contains at least one of metal particles made of a single metal composition, solder particles, metal particles plated with solder or metal, and resin particles plated with solder or metal.

32. The method of producing a connection structure according to claim 18, further comprising, prior to the step (i), the step of supplying a second powder-like conductive substance to the opposed top faces of either the connection terminals of the first plate body or the connection terminals of the second plate body preliminarily.

33. The method of producing a connection structure according to claim 32, wherein the second powder-like conductive substance is a powder-like conductive substance having a melting point different from that of the powder-like conductive substance used in the step (ii).

* * * * *